(12) United States Patent
Manssen et al.

(10) Patent No.: US 8,432,234 B2
(45) Date of Patent: Apr. 30, 2013

(54) METHOD AND APPARATUS FOR TUNING ANTENNAS IN A COMMUNICATION DEVICE

(75) Inventors: Keith R. Manssen, Bull Valley, IL (US); Matthew R. Greene, Crystal Lake, IL (US); Duane Rabe, Hawthorn Woods, IL (US)

(73) Assignee: Research In Motion RF, Inc., Wilmington, DE (US)

( * ) Notice: Subject to any disclaimer, the term of this patent is extended or adjusted under 35 U.S.C. 154(b) by 162 days.

(21) Appl. No.: 13/005,122

(22) Filed: Jan. 12, 2011

(65) Prior Publication Data

US 2012/0112851 A1 May 10, 2012

Related U.S. Application Data

(63) Continuation of application No. 12/941,972, filed on Nov. 8, 2010.

(51) Int. Cl.
*H03H 7/38* (2006.01)
*H04B 1/38* (2006.01)

(52) U.S. Cl.
USPC .......................................... 333/17.3; 455/73

(58) Field of Classification Search ............ 333/32, 333/17.3; 455/73, 77; 343/850, 745
See application file for complete search history.

(56) References Cited

U.S. PATENT DOCUMENTS

| | | | |
|---|---|---|---|
| 2,745,067 A | 5/1956 | True | |
| 3,117,279 A | 1/1964 | Ludvigson | |
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |

(Continued)

FOREIGN PATENT DOCUMENTS

| | | |
|---|---|---|
| DE | 19614655 | 10/1997 |
| DE | 102008050743 | 4/2010 |

(Continued)

OTHER PUBLICATIONS

Ida et al., "An Adaptive Impedance Matching System and Its Application to Mobile Antennas", TENCON 2004, IEEE Region 10 Conference, Nov. 21-24, 2004, pp. 543-547. See Abstract and p. 544, abstract only.

(Continued)

*Primary Examiner* — Dean O Takaoka
*Assistant Examiner* — Alan Wong
(74) *Attorney, Agent, or Firm* — Guntin & Gust, PLC; Andrew Gust

(57) ABSTRACT

A system that incorporates teachings of the present disclosure may include, for example, a matching network for a communication device having first and second antennas, where the matching network includes a first variable component connectable and a detector. The first variable component can be connectable along a first path between the first antenna and a front end module of the communication device, where the first antenna is configured for transmit and receive operation. The detector can be connectable along a second path between the second antenna and the front end module of the communication device, where the detector obtains an RF voltage associated with the second path, where the second antenna is configured for a diversity receive operation, and where the first variable component is adjusted based on the detected RF voltage to tune the matching network. Additional embodiments are disclosed.

18 Claims, 18 Drawing Sheets

U.S. PATENT DOCUMENTS

| | | |
|---|---|---|
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,777,490 A | 10/1988 | Sharma |
| 4,799,066 A | 1/1989 | Deacon |
| 4,965,607 A | 10/1990 | Wilkins |
| 5,032,805 A | 7/1991 | Elmer |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,561,407 A | 10/1996 | Koscica |
| 5,564,086 A | 10/1996 | Cygan |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,778,308 A | 7/1998 | Sroka |
| 5,786,727 A | 7/1998 | Sigmon |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,929,717 A | 7/1999 | Richardson |
| 5,963,871 A | 10/1999 | Zhinong |
| 5,969,582 A | 10/1999 | Boesch |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,133,883 A | 10/2000 | Munson |
| 6,172,385 B1 | 1/2001 | Duncombe |
| 6,215,644 B1 | 4/2001 | Dhuler |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit et al. |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,888,714 B2 | 5/2005 | Shaw |
| 6,905,989 B2 | 6/2005 | Ellis |
| 6,907,234 B2 | 6/2005 | Karr |
| 6,920,315 B1 | 7/2005 | Wilcox |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 7,009,455 B2 | 3/2006 | Toncich |
| 7,071,776 B2 | 7/2006 | Forrester |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |

| | | |
|---|---|---|
| 7,427,949 B2 | 9/2008 | Channabasappa et al. |
| 7,468,638 B1 | 12/2008 | Tsai |
| 7,535,080 B2 | 5/2009 | Zeng et al. |
| 7,535,312 B2 | 5/2009 | McKinzie |
| 7,539,527 B2 | 5/2009 | Jang |
| 7,596,357 B2 | 9/2009 | Nakamata |
| 7,633,355 B2 | 12/2009 | Matsuo |
| 7,667,663 B2 | 2/2010 | Hsiao |
| 7,705,692 B2 * | 4/2010 | Fukamachi et al. .......... 333/109 |
| 7,714,678 B2 | 5/2010 | du Toit |
| 7,728,693 B2 | 6/2010 | du Toit |
| 7,768,400 B2 | 8/2010 | Lawrence et al. |
| 7,786,819 B2 | 8/2010 | Ella |
| 7,795,990 B2 | 9/2010 | du Toit |
| 7,907,094 B2 * | 3/2011 | Kakitsu et al. ................ 343/702 |
| 7,917,104 B2 | 3/2011 | Manssen et al. |
| 7,969,257 B2 | 6/2011 | du Toit |
| 7,991,363 B2 | 8/2011 | Greene |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,217,732 B2 | 7/2012 | McKinzie |
| 8,320,850 B1 * | 11/2012 | Khlat ............................ 455/107 |
| 2002/0030566 A1 | 3/2002 | Bozler |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0232607 A1 | 12/2003 | Le Bars |
| 2004/0009754 A1 | 1/2004 | Edward |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0257293 A1 | 12/2004 | Friedrich |
| 2005/0007291 A1 | 1/2005 | Fabrega-Sanchez |
| 2005/0032488 A1 | 2/2005 | Pehlke |
| 2005/0042994 A1 | 2/2005 | Otaka |
| 2005/0059362 A1 | 3/2005 | Kalajo |
| 2005/0082636 A1 | 4/2005 | Yashima |
| 2005/0093624 A1 | 5/2005 | Forrester |
| 2005/0130608 A1 | 6/2005 | Forse |
| 2005/0130699 A1 | 6/2005 | Kim |
| 2005/0215204 A1 | 9/2005 | Wallace |
| 2005/0264455 A1 | 12/2005 | Talvitie |
| 2005/0282503 A1 | 12/2005 | Onno |
| 2006/0003537 A1 | 1/2006 | Sinha |
| 2006/0009165 A1 | 1/2006 | Alles |
| 2006/0160501 A1 | 7/2006 | Mendolia |
| 2006/0183433 A1 | 8/2006 | Mori et al. |
| 2006/0183442 A1 | 8/2006 | Chang |
| 2006/0205368 A1 | 9/2006 | Bustamante |
| 2006/0281423 A1 | 12/2006 | Caimi |
| 2007/0013483 A1 | 1/2007 | Stewart |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0142014 A1 | 6/2007 | Wilcox |
| 2007/0149146 A1 | 6/2007 | Hwang |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie |
| 2007/0200766 A1 | 8/2007 | McKinzie |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0055016 A1 | 3/2008 | Morris |
| 2008/0081670 A1 | 4/2008 | Rofougaran |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Guillaume |
| 2008/0274706 A1 | 11/2008 | Blin |
| 2008/0305479 A1 | 12/2008 | Ben-Bassat |
| 2009/0002077 A1 | 1/2009 | Rohani et al. |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0215446 A1 | 8/2009 | Hapsari et al. |
| 2009/0231220 A1 | 9/2009 | Yang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0323582 A1 | 12/2009 | Proctor et al. |
| 2010/0041348 A1 | 2/2010 | Wilcox et al. |
| 2010/0053009 A1 | 3/2010 | Ahmadreza |
| 2010/0073103 A1 | 3/2010 | Spears et al. |
| 2010/0085260 A1 | 4/2010 | McKinzie |
| 2010/0105425 A1 | 4/2010 | Asokan |
| 2010/0232474 A1 | 9/2010 | Ahmadreza |
| 2010/0285836 A1 * | 11/2010 | Horihata et al. ........... 455/552.1 |
| 2011/0012790 A1 | 1/2011 | Badaruzzaman |
| 2011/0102290 A1 | 5/2011 | Milosavljevic |
| 2011/0121079 A1 | 5/2011 | Lawrence et al. |
| 2011/0133994 A1 | 6/2011 | Korva |
| 2011/0183628 A1 | 7/2011 | Baker |
| 2011/0256857 A1 | 10/2011 | Chen et al. |
| 2012/0100802 A1 | 4/2012 | Mohebbi |

FOREIGN PATENT DOCUMENTS

| | | |
|---|---|---|
| EP | 0685936 | 6/1995 |
| EP | 0909024 | 9/1998 |
| EP | 1137192 | 9/2001 |
| EP | 1298810 | 4/2006 |
| JP | 03276901 | 3/1990 |
| WO | WO-2009/064968 | 5/2009 |
| WO | WO-2011/044592 | 4/2011 |
| WO | WO-2011/133657 | 10/2011 |
| WO | WO-2011028453 | 10/2011 |

OTHER PUBLICATIONS

Du Toit, , "Tunable Microwave Devices With Auto Adjusting Matching Circuit", U.S. Appl. No. 13/302,617, filed Nov. 22, 2011.

Greene, , "Method and Apparatus for Tuning a Communication Device", U.S. Appl. No. 13/108,463, filed May 16, 2011.

Hoirup, , "Method and Apparatus for Radio Antenna Frequency Tuning", U.S. Appl. No. 13/030,177, filed Feb. 18, 2011.

Manssen, , "Method and Apparatus for Managing Interference in a Communication Device", U.S. Appl. No. 61/326,206, filed Apr. 20, 2010.

Manssen, , "Method and Apparatus for Tuning Antennas in a Communication Device", U.S. Appl. No. 13/005,122, filed Jan. 12, 2011.

McKinzie, , "Adaptive Impedance Matching Module (AIMM) Control Architectures", U.S. Appl. No. 13/293,550, filed Nov. 10, 2011.

McKinzie, , "Method and Apparatus for Adaptive Impedance Matching", U.S. Appl. No. 13/217,748, filed Aug. 25, 2011.

Mendolia, , "Method and Apparatus for Tuning a Communication Device", U.S. Appl. No. 13/035,417, filed Feb. 25, 2011.

Paratek Microwave, Inc., , "Method and Appartus for Tuning Antennas in a Communication Device", International Application No. PCT/US11/59620; Filed Nov. 7, 2011.

Spears, , "Methods for Tuning an Adaptive Impedance Matching Network With a Look-Up Table", U.S. Appl. No. 13/297,951, filed Nov. 16, 2011.

Hyun, S., "Effects of strain on the dielectric properties of tunable dielectric SrTiO3 thin films", Applied Physics Letters, 2004 American Institute of Physics, Jul. 9, 2001.

Patent Cooperation Treaty, , "International Search Report and Written Opinion", International Application No. PCT/US2010/046241, Mar. 2, 2011.

Pervez, N.K., "High Tunability barium strontium titanate thin films for RF circuit applications", Applied Physics Letters, 2004 American Institute of Physics.

Qiao, et al., "Antenna Impedance Mismatch Measurement and Correction for Adaptive COMA Transceivers", IEEE, 2005.

Stemmer, Susanne, "Low-loss tunable capacitors fabricated directly on gold bottom electrodes", University of California Postprints 2006.

Taylor, T.R., "Impact of thermal strain on the dielectric constant of sputtered barium strontium titanate thin films", Applied Physics Letters, 2002 American Institute of Physics, yr 2002.

Tombak, Ali, Tunable Barium Strontium Titanate Thin Film Capacitors for RF and Microwave Applications. IEEE Microwave and Wireles Components Letters, vol. 12, Jan. 2002.

Xu, Hongtao, "Tunable Microwave Integrated Circuits using BST Thin Film Capacitors with Device", Integrated Ferroelectrics, Department of Electrical Engineering and Computer Engineering, University of California, 2005.

Patent Cooperation Treaty, , "International Search Report and Written Opinion", Nov. 16, 2011, International Application No. PCT/US/2011/038543.

Petit, Laurent, "MEMS-Switched Parasitic-Antenna Array for Radiation Pattern Diversity", IEEE Transactions on Antennas and Propagation, vol. 54, No. 9, Sep. 2009, 2624-2631.

Zuo, S., "Eigenmode Decoupling for Mimo Loop-Antenna Based on 180 Coupler", Progress In Electromagnetics Research Letters, vol. 26, 2011, 11-20.

Patent Cooperation Treaty, "International Search Report and Written Opinion", International Application No. PCT/US2010/056413, Jul. 27, 2011.

* cited by examiner

700

800

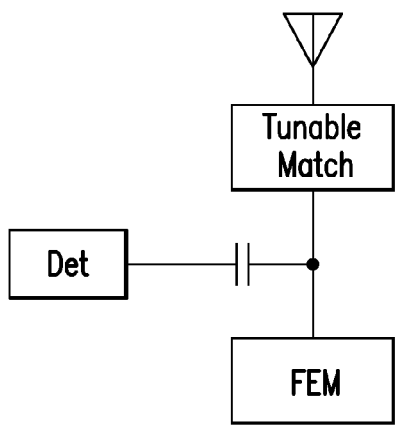
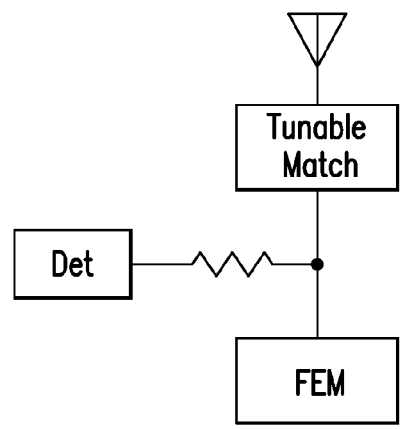
FIG. 8B    FIG. 8C
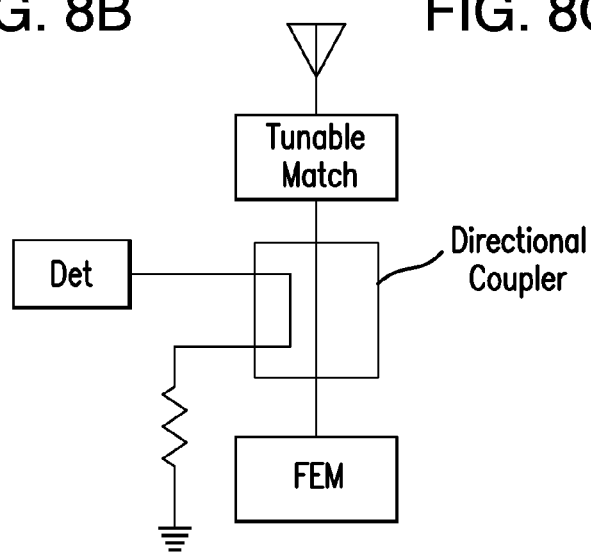
FIG. 8D
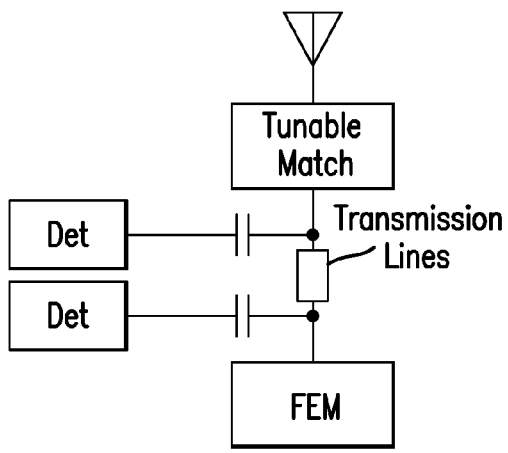
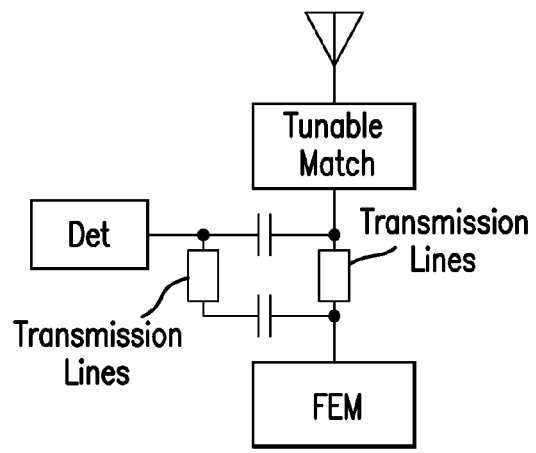
FIG. 8E    FIG. 8F 1. Set (C1TX,C2TX)
   Measure Tx signal
2. Set (C1RX,C2RX)
3. Set (C1TX',C2TX')
   Measure Tx signal
4. Set (C1RX',C2RX')
5. Set (C1TX'',C2TX''), converged to
   (C1TXopt,C2TXopt)
   Measure Tx signal
6. Set (C1RX'',C2RX''), converged to
   (C1RXopt,C2RXopt)

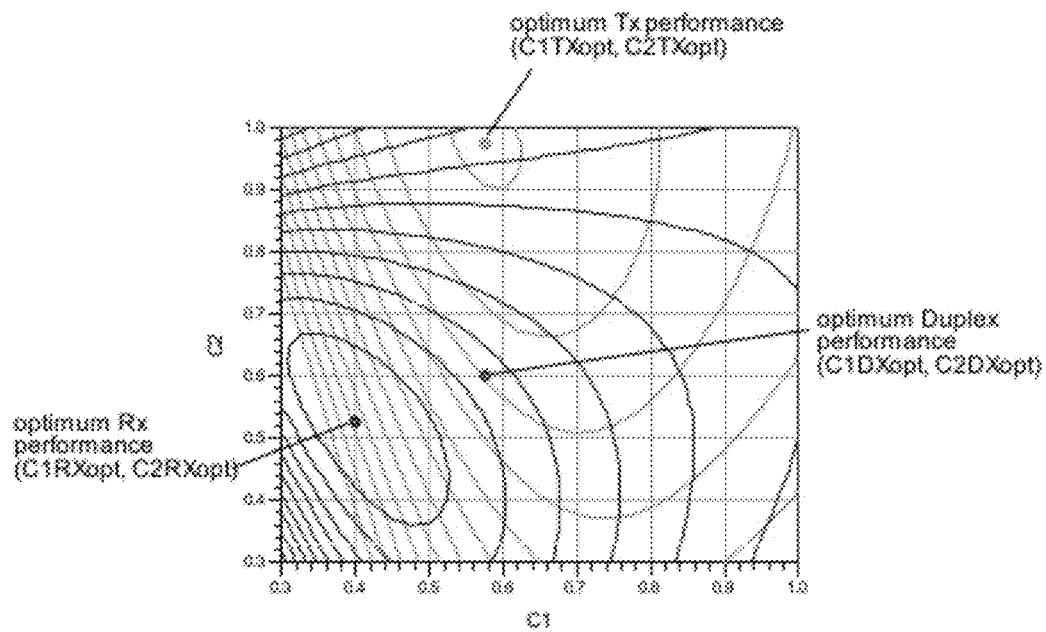
FIG. 8N: Tx and Rx Insertion Loss Contours
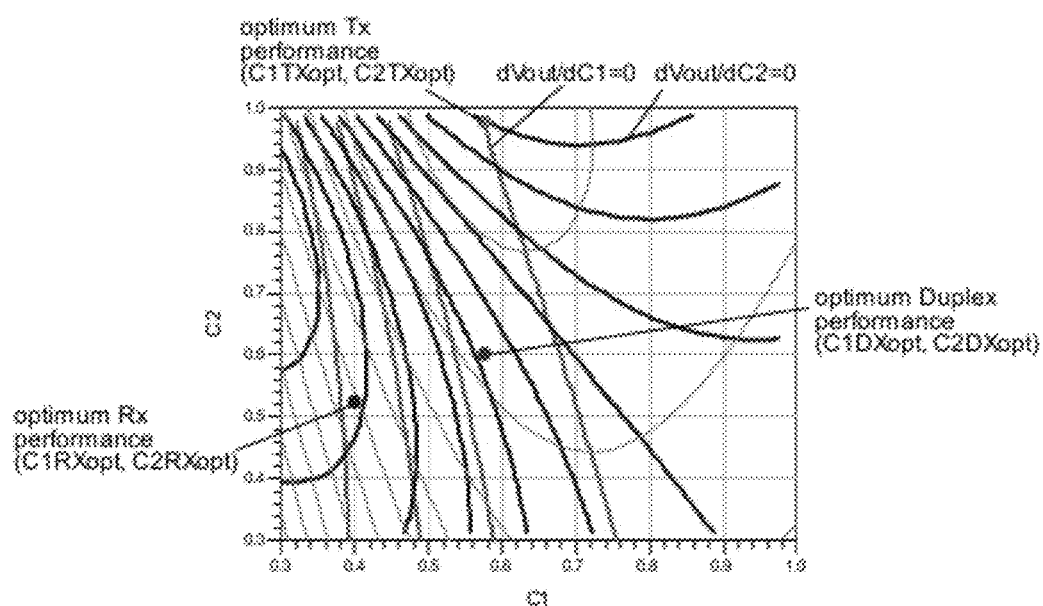
FIG. 8o: Vout and dVout Contours

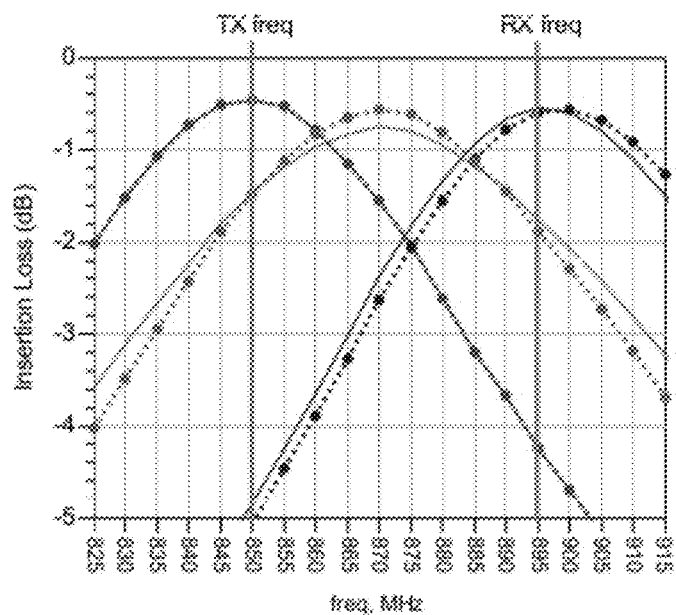
FIG. 8P: Closed loop result using FOM with dVout/dC1 and dVout/dC2
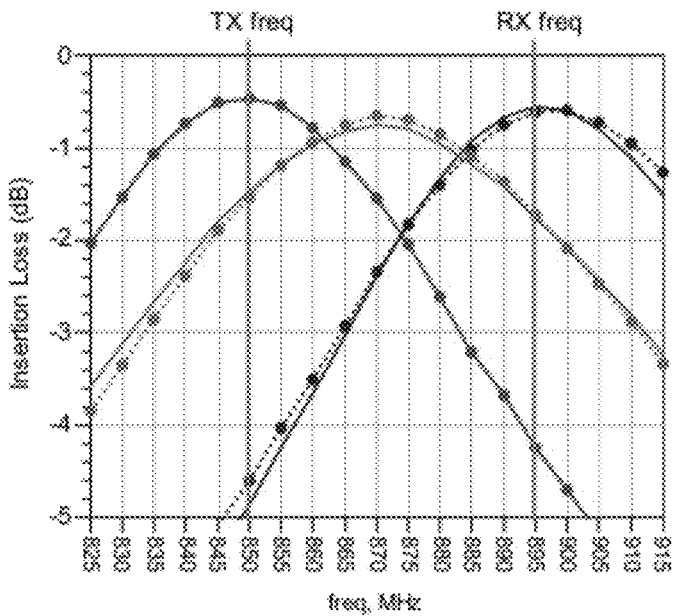
FIG 8Q: Closed loop result using FOM with dVout/dC2 and d²Vout/dC2dC1

900

LOOK-UP TABLE

| Band 1; Use Case 1; Desired tuning state |
|---|
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

1100

FIG. 11

METHOD AND APPARATUS FOR TUNING ANTENNAS IN A COMMUNICATION DEVICE

CROSS-REFERENCE TO RELATED APPLICATIONS

This application is a Continuation of U.S. patent application Ser. No. 12/941,972 filed on Nov. 8, 2010, the disclosure of which is hereby incorporated by reference in its entirety.

FIELD OF THE DISCLOSURE

The present disclosure relates generally to communication systems, and more specifically to a method and apparatus for tuning of antennas.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, the antenna designer is forced to compromise the performance in some of the frequency bands. An example of such a wireless device could be a mobile telephone that operates over a range of different frequencies, such as 800 MHz to 2200 MHz. The antenna will not radiate efficiently at all frequencies due to the nature of the design, and the power transfer between the antenna, the power amplifier, and the receiver in the radio will vary significantly.

Additionally, an antenna's performance is impacted by its operating environment. For example, multiple use cases exist for radio handsets, which include such conditions as the placement of the handset's antenna next to a user's head, or in the user's pocket or the covering of an antenna with a hand, can significantly impair wireless device efficiency. Further, many existing radios use a simple circuit composed of fixed value components that are aimed at improving the power transfer from power amplifier to antenna, or from the antenna to the receiver, but since the components used are fixed in value there is always a compromise when attempting to cover multiple frequency bands and multiple use cases.

BRIEF DESCRIPTION OF THE DRAWINGS

FIG. 8A-8F depict illustrative embodiments of a portion of a multiple antenna communication device;

FIGS. 8G-8Q depict a timing diagram and plots for various tuning methods using the communication device of FIG. 8A;

FIG. 11 depicts an illustrative embodiment of a look-up table utilized by one or more of the devices of FIGS. 1-9 and the method of FIG. 10.

DETAILED DESCRIPTION

Figure 1:
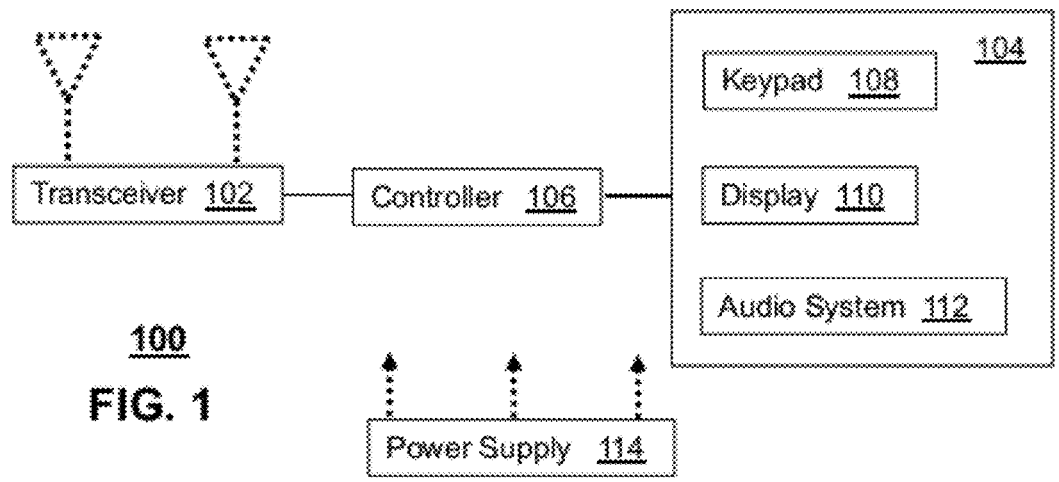
FIG. 1 depicts an illustrative embodiment of a communication device.

One embodiment of the present disclosure entails a matching network for a communication device having first and second antennas, where the matching network includes a first variable component connectable and a detector. The first variable component can be connectable along a first path between the first antenna and a front end module of the communication device. The detector can be connectable along a second path between the second antenna and the front end module of the communication device, where the detector obtains an RF voltage associated with the second path, and where the first variable component is adjusted based on the detected RF voltage to tune the matching network.

In another embodiment, the first antenna can be configured for transmit and receive operation while the second antenna can be configured for a diversity receive operation.

One embodiment of the present disclosure entails a matching network for a communication device. The matching network can include a matching circuit and a controller. The matching circuit can be connectable with an antenna, where the matching circuit includes one or more variable reactances with variable reactance values. The controller can be connectable with the matching circuit, where the controller is configured to obtain an RF voltage at an output of the matching circuit. The controller can be configured to determine derivative information associated with the RF voltage based on derivatives of the RF voltage and the variable reactance values, where the controller is configured to tune the matching circuit using the derivative information.

One embodiment of the present disclosure entails a method of tuning a communication device having first and second antennas. The method can include selectively switching a detector between first and second paths to obtain operational metrics, where the first path is between the first antenna and a front end module of the communication device, and the first path includes a first variable component. The second path is between the second antenna and the front end module of the communication device, and can include a second variable component. The method can also include independently tuning the first and second antennas by adjusting the first and second variable components based on the operational metrics.

One embodiment of the present disclosure can include a method including obtaining a first operational metric for a transmitter of a communication device and determining a range of impedances based on the first operational metric, where the range of impedances is associated with an acceptable level of performance for the communication device. The method can include obtaining a second operational metric for the transmitter and determining a target impedance within the range of impedances based on the second operational metric. The method can also include tuning a first impedance matching network based on the target impedance, where the first impedance matching network is coupled with a first antenna of the communication device. The tuning can be based on adjusting a first variable component of the first impedance matching network.

One embodiment of the present disclosure entails a method of tuning a communication device, where the method includes obtaining an RF voltage at an output of a tunable matching network of the communication device. The RF voltage can be obtained at a transmission frequency of the communication device using a detector, and the tunable matching network can have one or more variable capacitors with variable capacitance values. The method can further include determining derivative information associated with the RF voltage based on derivatives of the RF voltage and the variable capacitance values, and tuning the tunable matching network using the derivative information.

One embodiment of the present disclosure entails a non-transitory computer-readable storage medium with computer instructions to obtain one or more operational metrics for a transceiver of a communication device and calculate a current figure of merit as a function of the one or more operational metrics. The computer instructions can also compare the current figure of merit to a target figure of merit and adjust a setting of a variable component of a tunable matching network to a value expected to change the current figure of merit relative to the target figure of merit. The tunable matching network can be connected with one of a first antenna or a second antenna of the communication device.

One embodiment of the present disclosure entails a matching network for a communication device, where the matching network includes a first variable component connectable along a first path between a first antenna and a front end module of the communication device, and a second variable component connectable along a second path between a second antenna and the front end module of the communication device. The matching network can also include a switching element for selectively switching a detector between the first and second paths to obtain operational metrics, where the first and second antennas can be independently tuned by adjusting the first and second variable components based on the operational metrics.

FIG. 1 depicts an exemplary embodiment of a communication device 100. The communication device 100 can comprise a wireless transceiver 102 (herein having independent transmit and receive sections and having one or more antennas (two of which are shown in this example)), a user interface (UI) 104, a power supply 114, and a controller 106 for managing operations thereof. The wireless transceiver 102 can utilize short-range or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
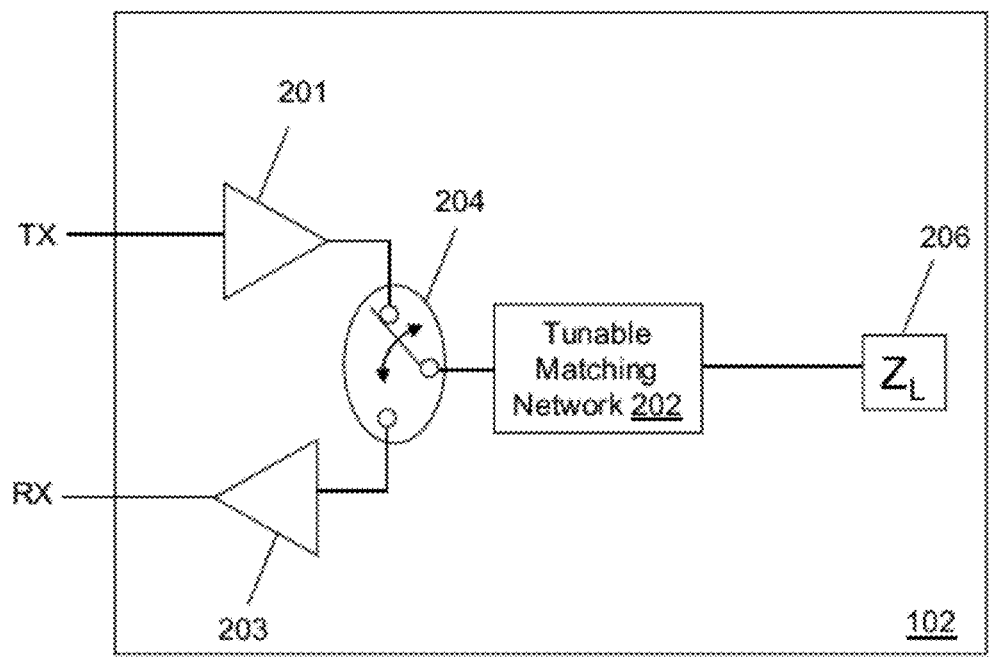
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include common amplifiers 201, 203 coupled to a tunable matching network 202 and an impedance load 206 by way of a switch 204. The load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA. These undisclosed configurations are contemplated by the present disclosure.

Figure 3:
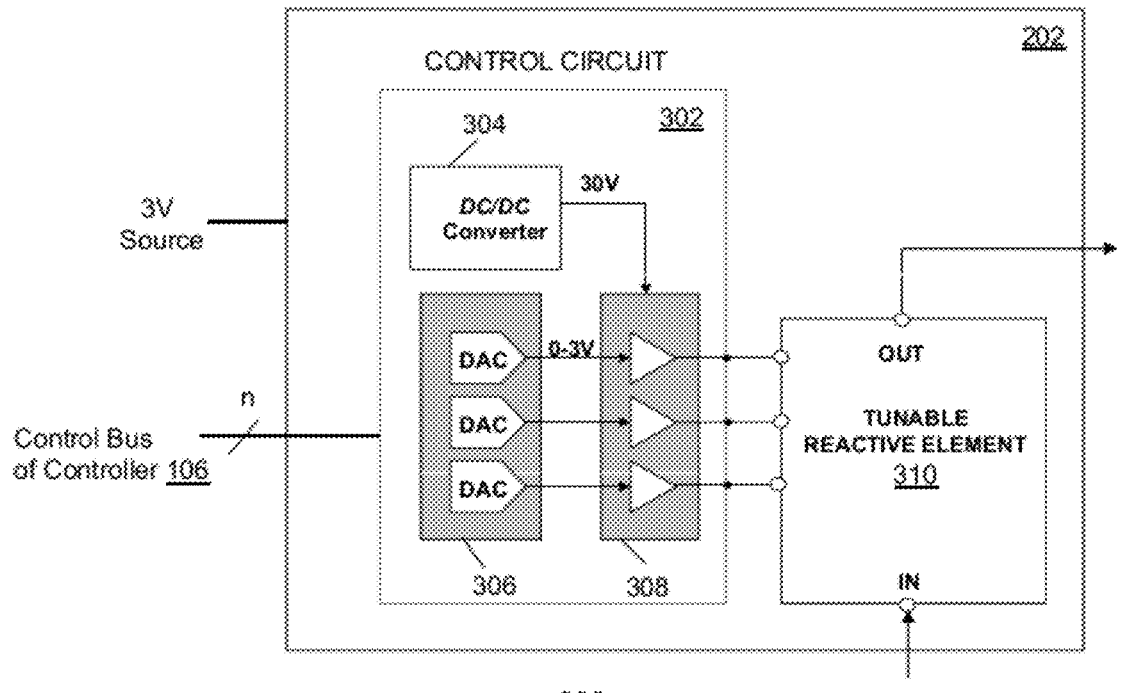
FIGS. 3-4 depict illustrative embodiments of a tunable matching network of the transceiver of FIG. 2.
Figure 4:
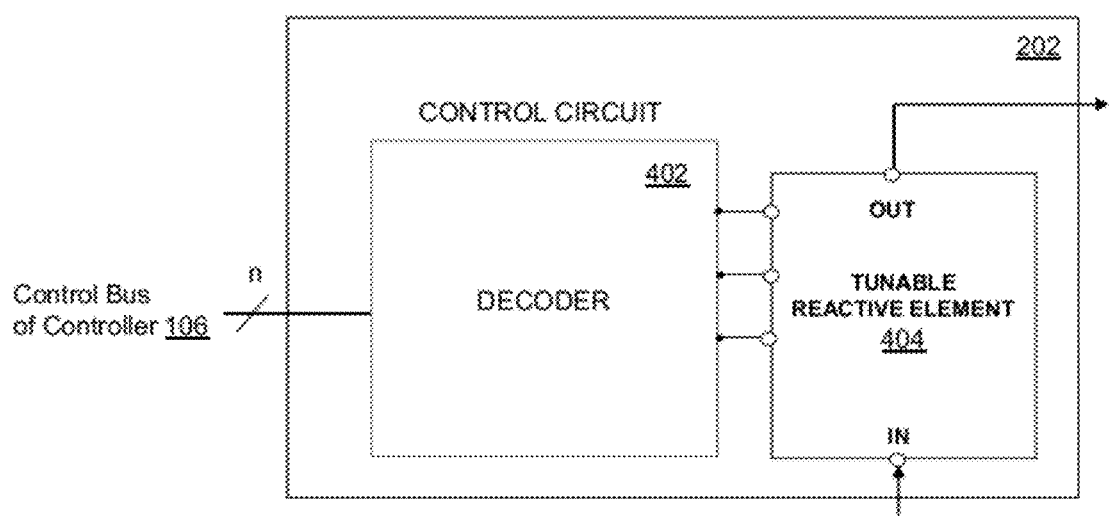
Figure 5:
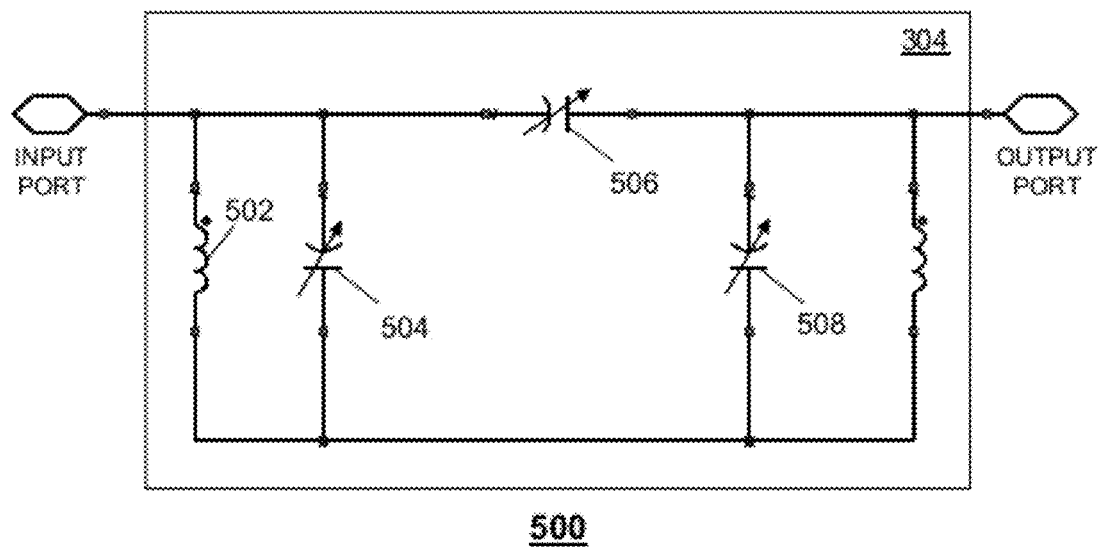
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration for the tunable reactive element 310. In this illustration, the tunable reactive element 310 includes three tunable capacitors 504-508 and an inductor 502 with a fixed inductance. Other circuit configurations are possible, and thereby contemplated by the present disclosure.

The tunable capacitors 504-508 can each utilize technology that enables tunability of the capacitance of said component. One embodiment of the tunable capacitors 504-508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504-508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3 or the switches of the tunable reactive element 404 of FIG. 4. The control circuit 302 of FIG. 3 can utilize common digital logic to implement the SPI bus and to direct digital signals supplied by the controller 106 to the DACs.

Figure 6:
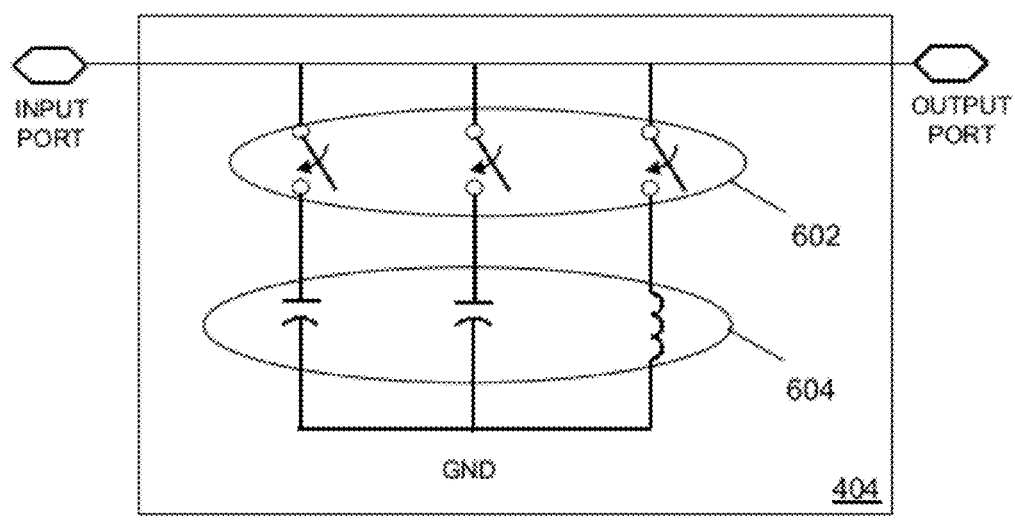

In another embodiment, the tunable matching network 202 can comprise a control circuit 402 in the form of a decoder and a tunable reactive element 404 comprising switchable reactive elements such as shown in FIG. 6. In this embodiment, the controller 106 can supply the control circuit 402 signals via the SPI bus which can be decoded with common Boolean or state machine logic to individually enable or disable the switching elements 602. The switching elements 602 can be implemented with semiconductor switches or micro-machined switches, such as utilized in micro-electro-mechanical systems (MEMS). By independently enabling and disabling the reactive elements (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so on.

Figure 7A:
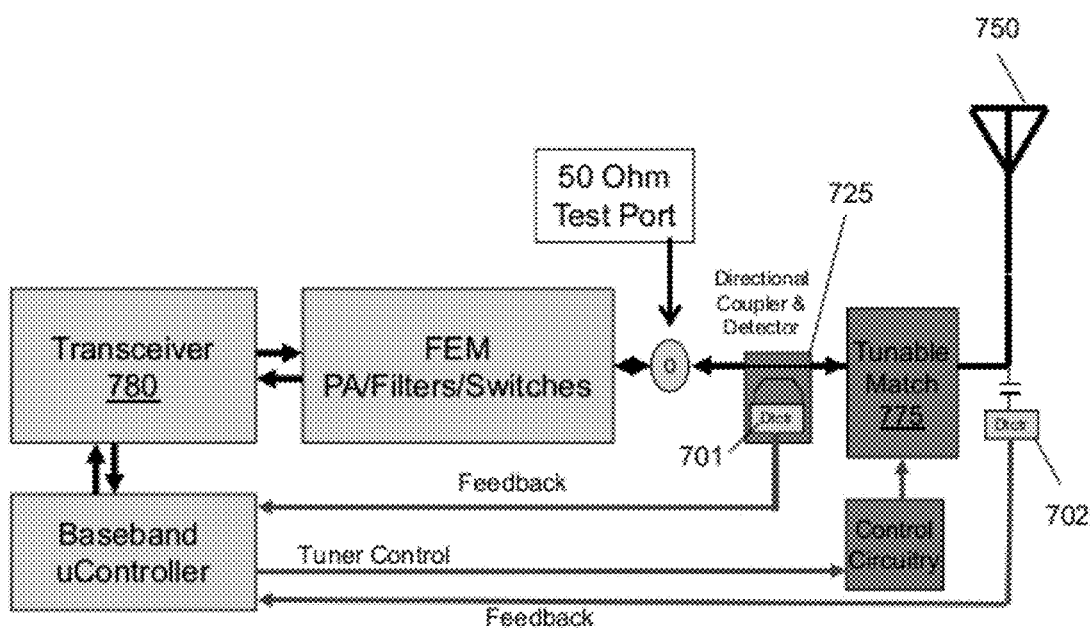
FIG. 7A depicts an illustrative embodiment of a portion of a communication device.
Figure 7B:
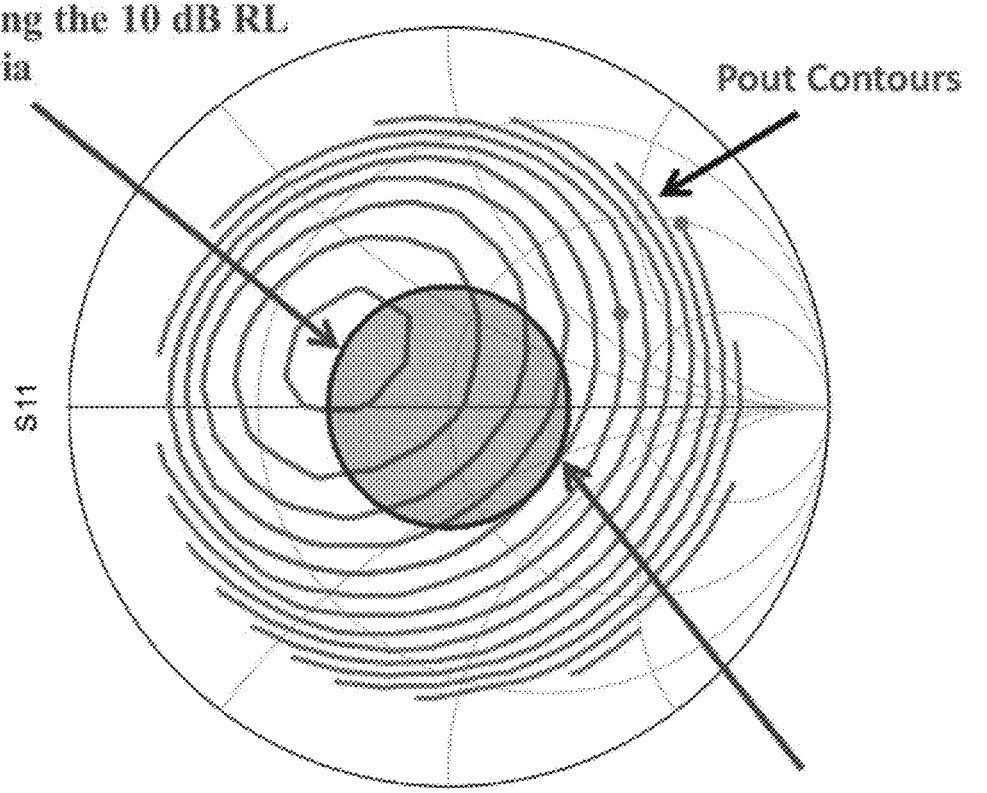
FIG. 7B depicts a smith chart illustrating output power vs. return loss.

FIG. 7A depicts an exemplary embodiment of a portion of a communication device 700 (such as device 100 in FIG. 1) having a tunable matching network which can include, or otherwise be coupled with, a number of components such as a directional coupler, a sensor IC, control circuitry and/or a tuner. The tunable matching network can include various other components in addition to, or in place of, the components shown, including components described above with respect to FIGS. 1-6. In addition to the detector 701 coupled to the directional coupler 725, there is shown a detector 702 coupled to the RF line feeding the antenna 750. A tunable matching network 775 can be coupled to the antenna 750 and a transceiver 780 (or transmitter and/or receiver) for facilitating communication of signals between the communication device 700 and another device or system. In this exemplary embodiment, the tunable match can be adjusted using all or a portion of the detectors for feedback to the tuning algorithm. FIG. 7B depicts a smith chart illustrating output power vs. load impedance for a communication device with a tunable network.

Various algorithms can be utilized for tuning of the antenna 750, some of which are disclosed in U.S. Patent Application Publication No. 2009/0121963 filed on Nov. 14, 2007 by Greene, the disclosure of which is hereby incorporated by reference herein. The Greene Application describes several methods utilizing Figures of Merit, which in this exemplary embodiment can be determined in whole or in part from measurements of the forward and reverse signals present at detector 701. This exemplary embodiment, can also utilize detector 702 to further improve the ability of the tuning system to enable improved performance of the communication device. One embodiment of the algorithm can utilize the inputs from detector 701 to establish a maximum return loss or VSWR for the matching network. This method can establish a range of impedances around the targeted impedance. This range of impedances may establish an acceptable level of performance. Input from detector 702 can then be utilized to allow the algorithm to find an improved or best impedance within that acceptable range. For instance, the algorithm could continue to modify the matching network 775 in order to increase the RF voltage detected at the antenna feed, while constraining the return loss (measured by detector 701) to stay within the target return loss. In this embodiment, communication device 700 can allow tuning for source impedances that are not 50 ohms In this example, the lowest insertion loss can be chosen for the tuning algorithm.

In another embodiment, the tuning algorithm can maintain the return loss while minimizing the current drain to determine desired tuning values. The tuning algorithm can utilize various parameters for tuning the device, including output power of the transmitter, return loss, received power, current drain and/or transmitter linearity.

Figure 8A:
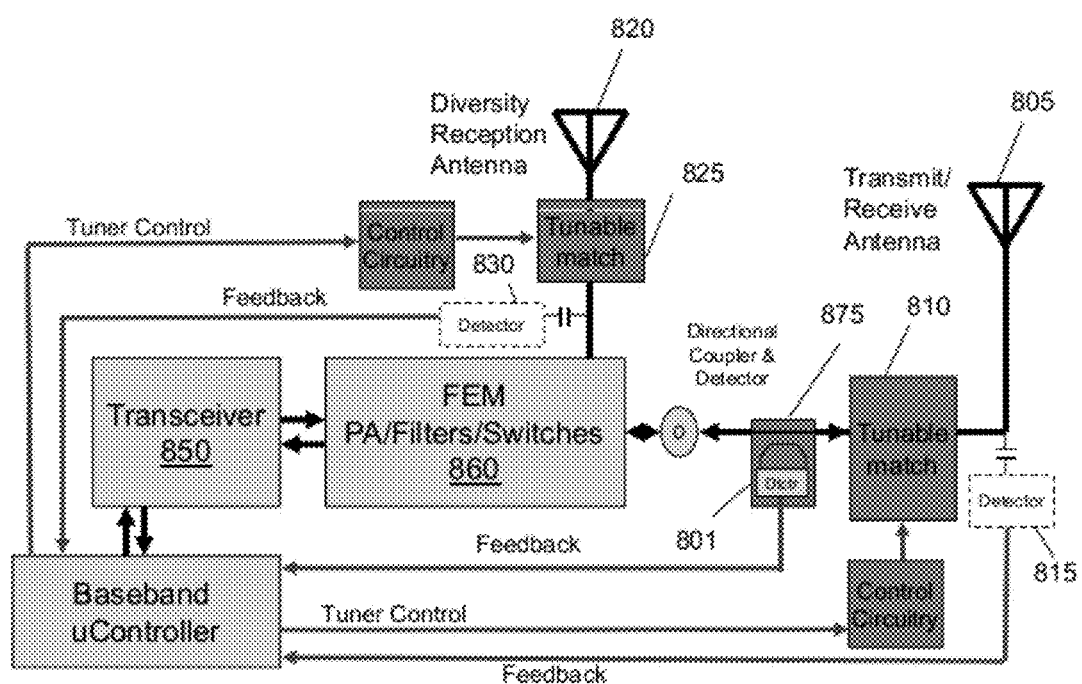

In another exemplary embodiment, FIG. 8A depicts a portion of a communication device 800 (such as device 100 in FIG. 1) having tunable matching networks for use with a multiple antenna system. In this exemplary embodiment, there are two antennas, which are a transmit/receive antenna 805 and a diversity reception antenna 820. However, it should be understood that other numbers, types and/or configurations of antennas can be utilized with device 800. For instance, the antennas can be spatially diverse, pattern diverse, polarization diverse and/or adaptive array antennas. In one embodiment, the antennas can be part of a MIMO (multiple-input and multiple output) system. The multiple antennas can be utilized for improving communications, such as through switching or selecting techniques, including analyzing noise in the multiple signals and selecting the most appropriate signal. The multiple antennas can also be used with combining techniques where the signals can be added together, such as equal gain combining or maximal-ratio combining. Other techniques for utilizing multiple signals from multiple antennas are also contemplated by the exemplary embodiments, including dynamic systems that can adjust the particular techniques being utilized, such as selectively applying a switching technique and a combination technique. The particular position(s) of the antenna(s) can vary and can be selected based on a number of factors, including being in close enough proximity to couple RF energy with each other.

Communication device 800 can include a number of other components such as tunable matching networks which can include or otherwise be coupled with a number of components such as directional couplers, sensor ICs, bias control and other control ICs and tunable matching networks. The tunable matching networks can include various other components in addition to, or in place of the components shown, including components described above with respect to FIGS. 1-7. This example also includes a transceiver 850 of the communication device 800 that includes multiple receivers and/or transmitters for the multiple antennas 805 and 820 to serve the purpose of diversity reception.

In one embodiment, a first tunable matching network 810 can be coupled at the input to the transmit/receive antenna 805 and a second tunable matching network 825 can be coupled to the input to the diversity reception antenna 820. Both of these matching networks 810 and 825 can be adjusted (e.g., tuned) to improve performance of the communication device 800 in response to changes in bands, frequencies of operation, physical use cases and/or proximity of the antennas 805 and 820 to the user or other objects which can affect the impedances presented by the antennas to the Front End Module (FEM) 860 and transceiver 850. In one embodiment, the feedback line could be removed, such as by using the FEM to route these signals appropriately to perform these measurements (e.g., avoiding filtering out the signals).

Tunable matching network 810 can be adjusted using different methods and/or components, some of which were disclosed in U.S. Patent Application Publication No. 2009/0121963. In one embodiment, a detector 830 can be coupled to the device 800 so as to detect RF voltage present at the connection to the diversity reception antenna 820. Received power levels at this point may be below −50 dBm. Some detectors, such as a diode detector or a logarithmic amplifier, may not typically be adequate to detect such levels. However, since in this exemplary embodiment, the two antennas 805 and 820 are in the same device 800 and in proximity to each other, they can inherently couple RF energy from one antenna to the other. While the communication device 800 does not require this coupling, its presence can be utilized by the exemplary embodiments for the purposes of tuning the antenna matching networks. In one example, after establishing the tuning state for the diversity match at the transmit frequency, a predetermined relationship or offset can be applied to the matching network 825 in order to adjust the match to the receiver operating frequency.

In one embodiment, the tunable match on the transmit/receive antenna 805 can be tuned similar to the technique described above with respect to FIG. 7A but instead of using detector 815, detector 830 can be used to measure increases in transmitted RF power coupled to the diversity reception antenna 820. As such, detector 815 (shown in broken lines in FIG. 8A) can be removed from the device 800, thereby reducing the cost and complexity. Thus, this example would tune both antennas utilizing only one detector (e.g., detector 830) coupled with one of the antennas (e.g., the diversity reception antenna 820) and without another detector coupled to the other antenna. This example relies upon a fairly constant coupling coefficient between the two antennas at any particular band, frequency and use case, and for any operation of the algorithm these may all be considered constant.

Communication device 800 can include other components and configurations for determining, or otherwise measuring, parameters to obtain the desired tuning. Various configurations are illustrated in FIGS. 8B-8F. FIG. 8B illustrates a capacitive coupling configuration between the tunable matching network and the FEM. FIG. 8C illustrates a resistive coupling between the tunable matching network and the FEM for obtaining the desired parameters. The FEM 860 in the diversity path of the communication device 800 may be highly reflective at the transmission frequency. This can create a standing wave and the detector may be at a voltage minimum causing detection to be made more difficult for the capacitive and resistive couplings shown in FIGS. 8A and 8B. In FIG. 8D, a directional coupler can be utilized to sample only the forward power, which allows for obtaining the desired parameters despite the existence of any standing wave in the diversity path. FIGS. 8E and 8F utilize detectors, but sample multiple points along the path to avoid sampling at a voltage minimum.

In another embodiment, after tunable matching network 810 is adjusted by the algorithm, tunable matching network 825 can also be adjusted. By measuring the coupled transmitted power present at detector 830, the tunable matching network 825 can be adjusted to increase coupled transmitter power seen at detector 830. In one example, after establishing the tuning state for the diversity match at the transmit frequency, a predetermined relationship or offset can be applied to the matching network 825 in order to adjust the match to the receiver operating frequency. For instance, the tuning circuits can be adjusted initially based on transmitter oriented metrics and then a predetermined relationship or offset can be applied to attain a desired tuning state for both transmitter and receiver operation. In another embodiment, the operational metric can be one or more of transmitter reflection loss, output power of the transmitter, current drain and/or transmitter linearity.

For example, in a time division multiplexed (TDM) system in which the transmitter and the receiver operate at different frequencies but only operate in their respective time slots (i.e., transmit time slot and receive time slot), this can be accomplished by identifying an optimal tuning for the transmitter and then adding an empirically derived adjustment to the tuning circuits in receive mode. As another example, in a frequency division multiplexed (FDM) system in which the transmitter and receiver operate simultaneously and at different frequencies, this can be accomplished by identifying a target operation for the transmitter, and then adjusting the tuning circuits first to the target value for the transmitter and then adjusting the values to approach a compromised value proximate to an equal or desired target value for the receiver. In one embodiment, a predetermined relationship, (e.g., an offset, scaling factor, translation or other change or modification) can be applied to the adjustments of the variable components when switching from the transmit mode to the receive mode. This translation can be a function of the values obtained while adjusting during the transmit time slot. The translation can then be removed upon return to the transmitter mode and the adjustment process is resumed. In one embodiment, because any frequency offset between the transmit signal and the receive signal is known, an adjustment or modification of the setting of the matching network in the form of a translation or some other function can be applied to the matching network during the receive time slot. In another embodiment, the adjustment can be performed in multiple steps if the transmission and reception frequencies are far apart.

In another embodiment, a Figure of Merit can be utilized that not only incorporates the transmit metrics, but also incorporates an element to attain a compromise between optimal transmitter and optimal receiver operation. This can be accomplished by identifying a target operation goal, such as a desired transmitter and receiver reflection loss and then identifying an operational setting that is a close compromise between the two. This embodiment thus can incorporate not only transmitter metrics but also tuning circuit settings or preferences into the algorithm. The tuning preferences can be empirically identified to ensure the desired operation.

In one embodiment where the communication device 800 employs antenna diversity for receive operation but does not employ antenna diversity for transmit operation, antenna 820 would be receive only. The transceiver can transmit on antenna 805 and can receive on both antennas 805 and 820. For adaptive closed loop tuning of the tunable matching network 825 on the diversity antenna, the communication device 800 can obtain a metric indicating the performance of the tunable matching circuit at the receive frequency. The metric can be used to tune the match to adjust the performance at the receive frequency. This can be done by measuring the level of the received signal using the receiver in the transceiver IC. This measurement is known as RSSI, received signal strength indicator. An RSSI measurement can be very noisy and unstable due to highly variable impairments in the propagation channel, such as fading. These variations can be filtered using averaging. However, the amount of averaging necessary could make such a measurement prohibitively slow and not suitable as feedback for closed loop antenna tuning.

In this embodiment, the transmit signal is moderately coupled to the tunable match in the diversity path because the main antenna and the diversity antenna are located on the same communications device. The main antenna and the diversity antenna may only have 20 dB isolation in many cases. The transmit signal present at tunable match 825 may be a much stronger and more stable signal than the receive signal present at tunable matching network 825. The transmit signal can be used to make reliable measurements that can be used for closed loop tuning.

The transmit signal can be measured using detector 830. The detector can be placed between the tunable match and the transceiver. This is effectively the output of the tunable match. A directional coupler is not necessary for this measurement in this embodiment, and capacitive or resistive coupling may be used, as long as the detector has sufficient dynamic range. Other components and configurations of the components can also be utilized for the parameter detection, such as shown in U.S. Patent Publication No. 20090039976 by McKinzie, the disclosure of which is hereby incorporated by reference.

In this embodiment, maximizing the output voltage of a tunable match can be the equivalent to minimizing insertion loss, and for a lossless network it can be equivalent to minimizing mismatch loss. An alternative to using detector 830 is to use the receiver itself (tuned to the transmit frequency) to measure the transmit signal. These are a few viable methods for measuring the transmit signal through the diversity tunable match. Other forms of signal detection are contemplated by the present disclosure.

A complication with using the transmit signal for tuning can be that it is at a different frequency than the receive signal and the objective of the tunable match in the diversity path is to adjust performance at the receive frequency. In one exemplary method, the tunable matching circuit is adjusted for reception performance based on transmission measurements. In this exemplary method, a tunable match can be optimized at the transmit frequency using measurements on the transmit signal and then the matching circuit can be adjusted using a predetermined relationship between the transmit settings and the receive settings to provide the desired performance at the receive frequency.

Figure 8G:
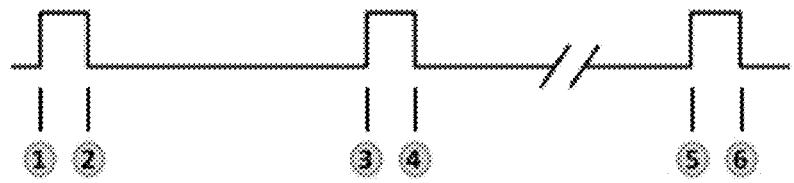
Figure 8H:
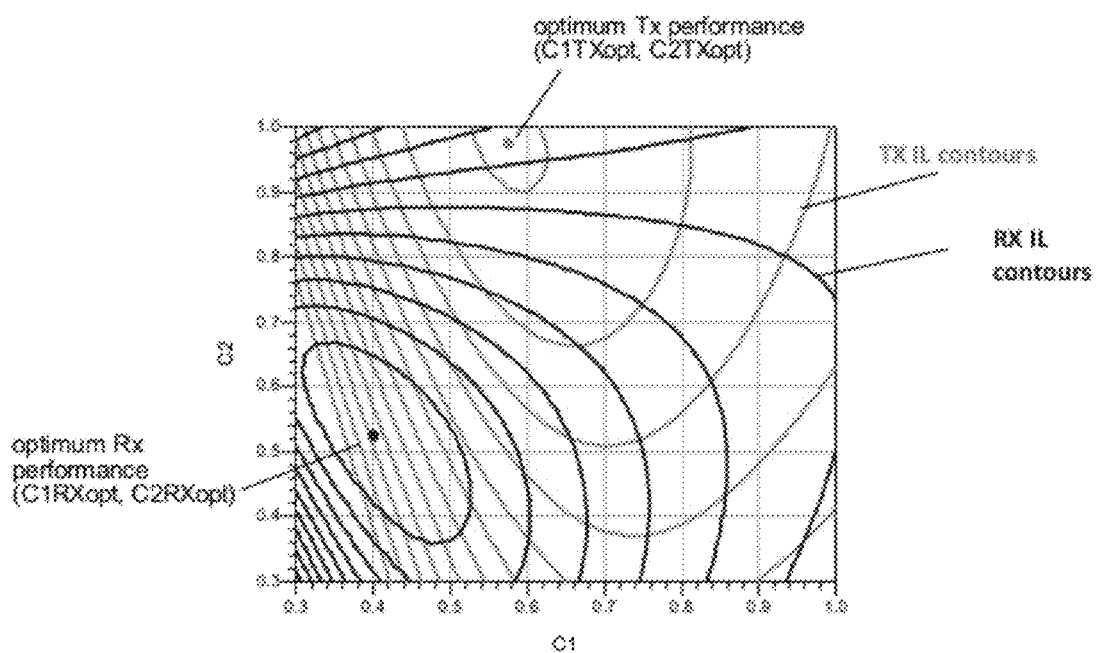
Figure 8I:
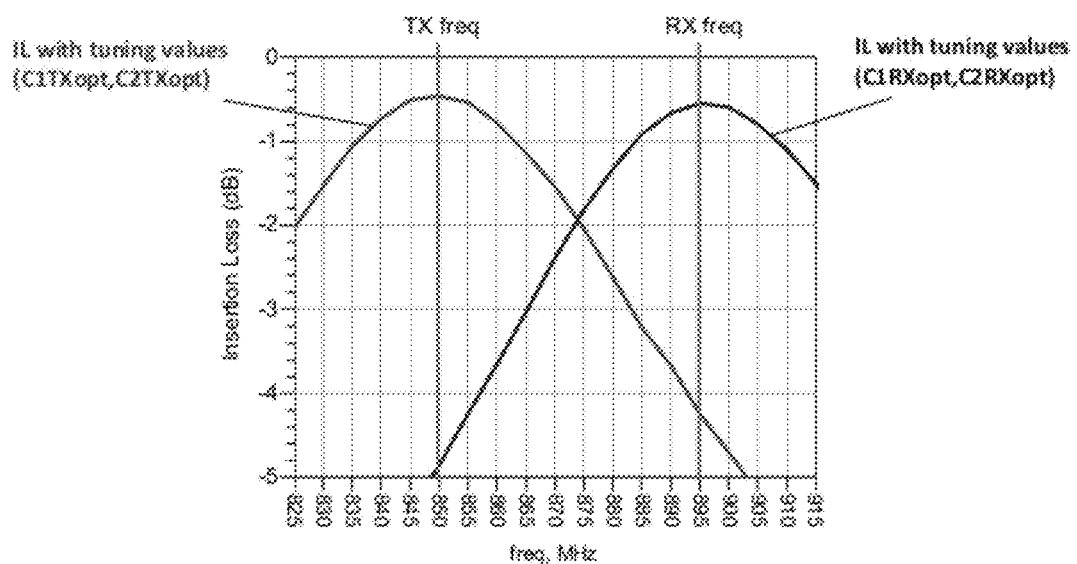

Referring to FIGS. 8G-8I and applying this same technique to tuning the diversity antenna, there can be two sets of tuning values for the tunable capacitors. This is illustrated in the timing diagram of FIG. 8G and the plots of FIGS. 8H and 8I, where the exemplary tunable matching network contains two tunable capacitors. One set of tuning values, designated (C1TX, C2TX), can be applied only during the measurement of the transmit signal. The other set of tuning values, designated (C1RX, C2RX), can be applied in between the transmit measurements. In this embodiment, the Rx tuning values are a function of the Tx tuning values. As the Tx values adaptively change throughout the iterative algorithm, the Rx values will also change, tracking the Tx values with a predetermined relationship. If the figure of merit is set to maximize Vout, the Tx solution can converge at (C1TXopt, C2TXopt), and can be appropriately adjusted using the predetermined relationship to (C1RXopt, C2RXopt) to achieve the desired RX performance.

Each time the tunable match is set to (C1TX, C2TX) in order to perform a Tx measurement, the performance at the Rx frequency may be degraded during the time that (C1TX, C2TX) is applied. It is desirable in this embodiment to perform the measurement as quickly as possible to minimize the Rx degradation caused by Tx tuning during the measurement. In one embodiment, the Tx values can be applied for less than one percent of the time while still achieving adequate convergence time.

Referring to FIGS. 8J-8M, another exemplary method for controlling the tuning can be employed, which does not require setting the tunable capacitors to values optimized for transmission while performing the Tx measurement. The objective is to operate the tuning matching network at settings that optimize Rx performance. These settings are at capacitance values that are a specific amount away from the Tx optimum in a specific direction. An algorithm can be utilized that will find this location in the capacitance plane without first needing to find the Tx optimum. The Tx level can change based on a number of circumstances, such as from power control commands in the transceiver or from variations in supply voltage, temperature, component tolerances, and so forth. In this embodiment, since only measurement of the output RF voltage of the tuner is being performed, a determination may not be made as to whether the algorithm is at the Tx optimum or a specific amount away from the Tx optimum because the Tx level is changing. This may prevent the use of an algorithm that simply targets a specific Tx signal level.

Figure 8J:
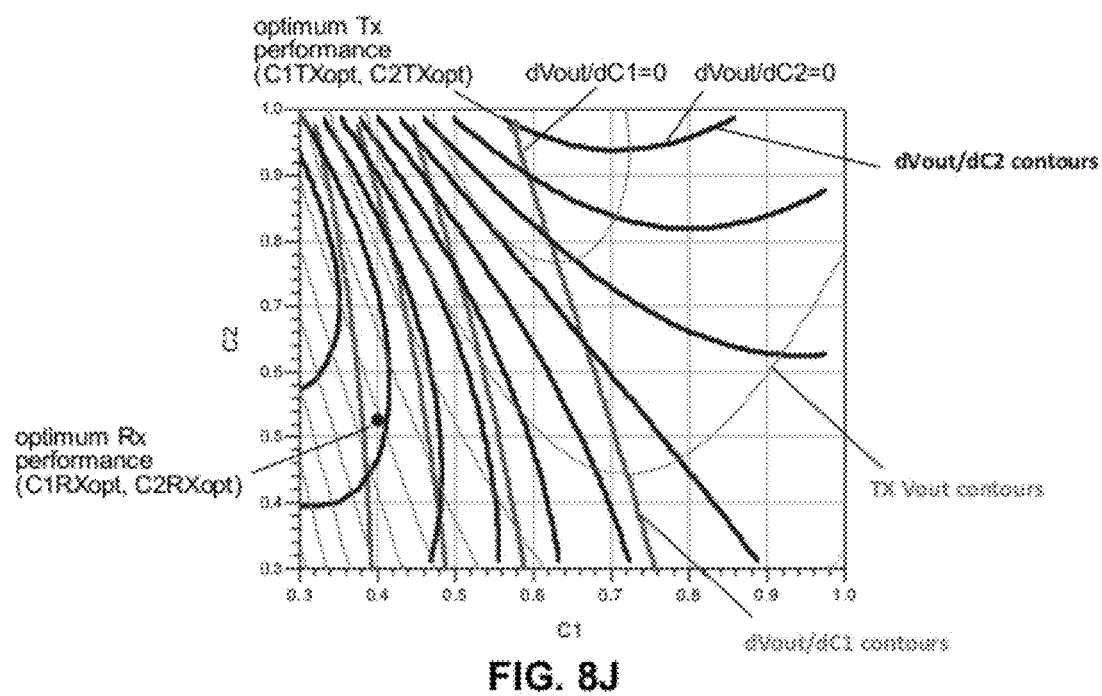
Figure 8K:
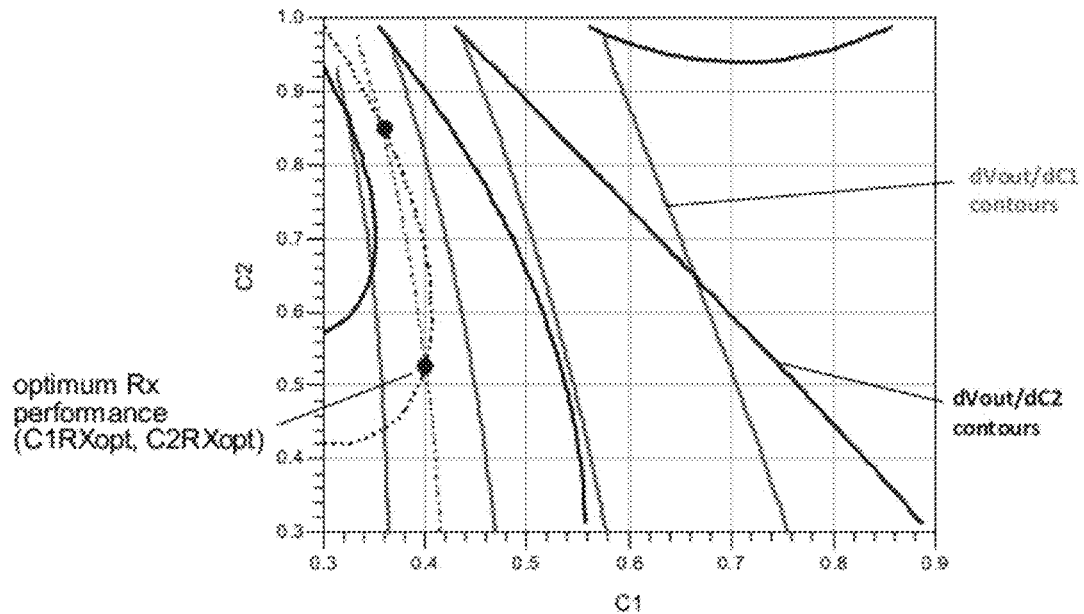

A metric that can be useful in determining where the tuning matching network is operating relative to the Tx optimum is to utilize the slope, or derivative of the Tx level with respect to the value or setting of the tunable capacitors. If the RF voltage (Vout) present at the output of the tunable match at the TX frequency is determined, such as through use of a log detector, then the first derivatives are dVout/dC1 and dVout/dC2. These derivatives can be calculated using the finite difference of two sequential measurements. These slopes will be a function of the tunable capacitors as shown in FIG. 8J. These slopes will not be a function of the absolute power level of the Tx signal since we are using a log detector. If a log detector or its equivalent is not utilized, the logarithm of the Tx voltage can be calculated prior to calculating the slope. By defining a Figure of Merit that includes dVout/dC1 and dVout/dC2, the algorithm can converge to a solution that is a specific amount away from the Tx optimum in a specific direction, in this case near the Rx optimum. In this embodiment, a log detector is a device having a logarithmic response.

Figure 8L:
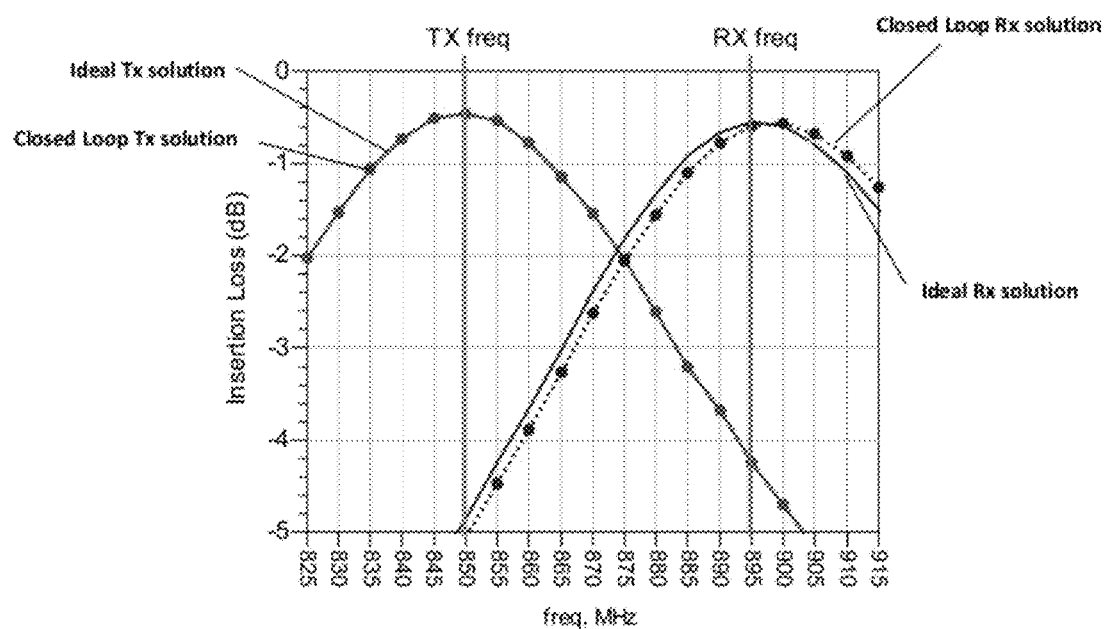

In some cases, specifying the slopes alone will not result in a unique solution (i.e., there may be multiple solutions). This is illustrated by the two intersection points along the contours in FIG. 8K. The algorithm can resolve this situation by adding a PTC preference to the Figure of Merit. A tunable match may have many solutions that meet a Tx RL goal and a PTC preference can be included in the Figure of Merit to identify a solution that not only meets the Tx RL goal but also meets an Rx performance goal. Similarly, a tunable match may have many solutions that meet a slope criteria and a PTC preference can be included in the Figure of Merit to identify a solution that not only meets the slope criteria but also meets an Rx performance goal. FIG. 8L illustrates the result of using a Figure of Merit that includes dVout/dC1, dVout/dC2, and a PTC preference.

Figure 8M:
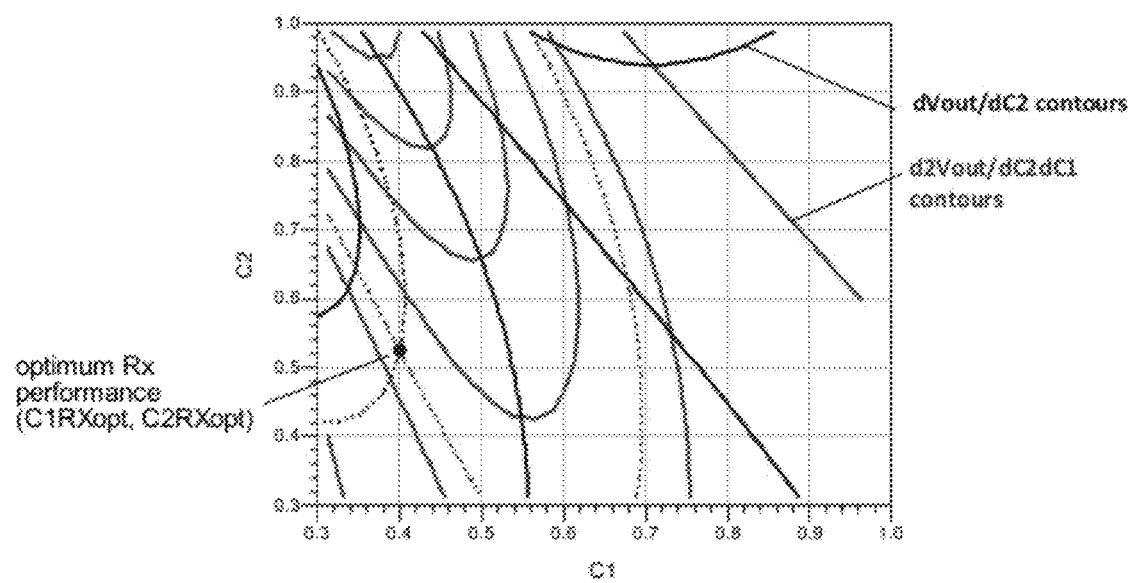

In cases where using dVout alone results in multiple solutions, it is also possible to use the second derivative to resolve these cases. FIG. 8M illustrates use of second derivatives ($d^2$Vout/dC2$d$C1), which is dVout/dC2 differentiated with respect to C1. It can be seen that specifying dVout/dC2 and $d^2$Vout/dC2$d$C1 can identify the correct or desired Rx solution from the multiple solutions. This exemplary method can include determining derivative information (e.g., one or more of a first derivative, and/or a second derivative, and/or etc.) associated with the RF voltage based on derivatives of the RF voltage and the variable capacitance values, and tuning the tunable matching network using the derivative information.

Referring to FIGS. 8N-8Q, another exemplary embodiment can use detector 830 of the communication device 800 in the diversity path as feedback to adjust tunable matching network 810 on the main antenna 805. The tunable matching network 810 coupled with the main antenna has both transmit and receive signals, and can be optimized for Tx performance, Rx performance, and Duplex performance. For the Tx solution, Vout can be maximized. For the Rx solution and the Duplex solution, dVout can be included in the Figure of Merit. FIG. 8N illustrates Tx and Rx IL contours and identifies the optimum tuning for Tx, Rx, and Duplex operation. FIG. 8o overlays the dVout contours with the optimal tuning solutions. It can be seen that in this case a PTC preference is required to identify the optimal Rx solution but is not required to identify the optimal duplex solution. FIG. 8P illustrates the closed loop result using a Figure of Merit with dVout/dC1 and dVout/dC2. FIG. 8Q illustrates the closed loop result using a Figure of Merit with dVout/dC2 and $d^2$Vout/dC2$d$C1.

In one or more exemplary embodiments, the Figure of Merit may be constructed such that when it equals a certain value, or is minimized or maximized, the desired tuner settings are achieved. The Figure of Merit may be used with a number of different optimization algorithms. For example, a more exhaustive approach may be used that evaluates the Figure of Merit at every combination of capacitor values. Other suitable algorithms can also be utilized, including a simplex algorithm, a binary search algorithm, and/or a gradient algorithm.

In another embodiment, communication device 800 can tune antennas 805 and 820 without using detectors 815 and 830. The tunable matching network 810 can be adjusted using several different methods, some of which were disclosed in U.S. Patent Application Publication US 2009/0121963. After the tunable matching network 810 is adjusted, the tunable matching network 825 can be adjusted. By monitoring the detector 801 coupled to the directional coupler 875, the diversity match tuning state can be determined which adjusts the tunable matching network 825 to the transmit frequency. If significant coupling between the two antennas 805 and 820 is assumed, and by monitoring the return loss of the transmit/receive match while adjusting the diversity reception antenna 820 match during transmitting, the diversity match tuning state can be determined which tunes the diversity reception antenna 820 to the transmit frequency. This tuning state can minimize the return loss at the transmit frequency as measured at the directional coupler 875. After finding this tuning state the tunable matching network 825 can then be adjusted (e.g., offset) appropriately for the receive frequency.

Figure 9:
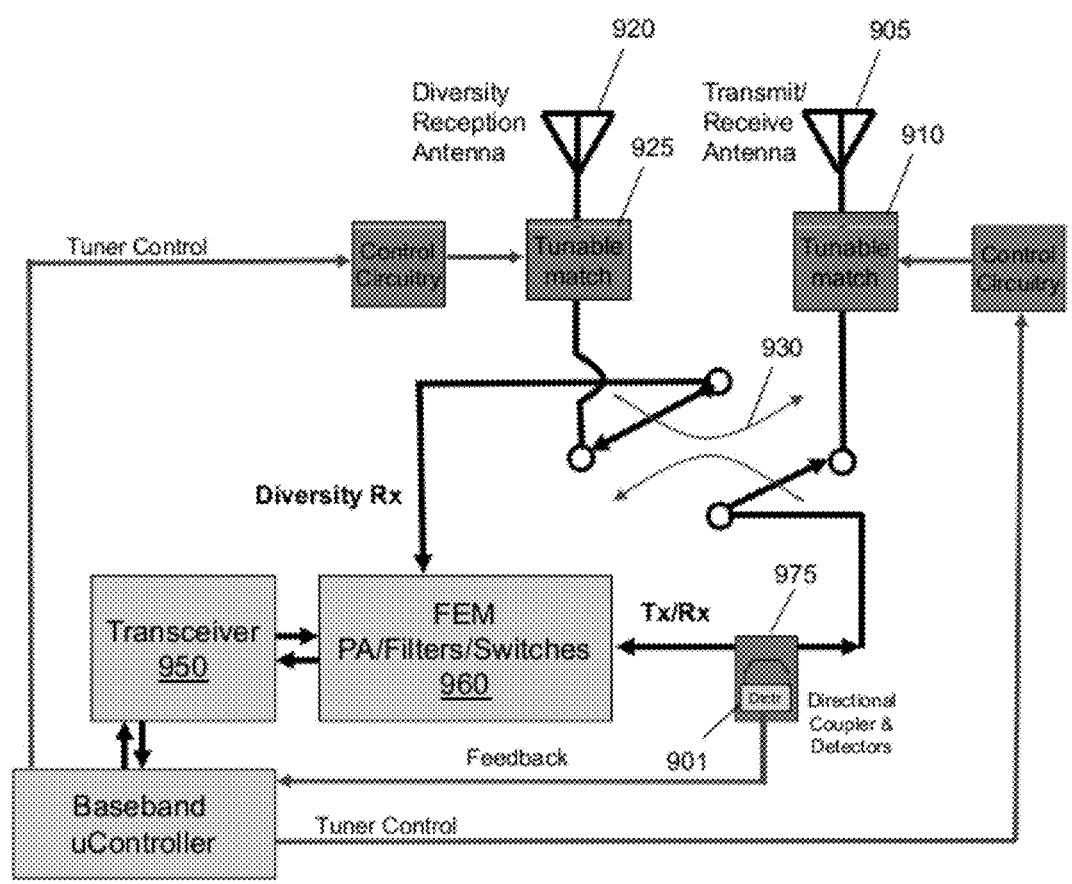
FIG. 9 depicts an illustrative embodiment of a portion of another multiple antenna communication device.

In another exemplary embodiment, FIG. 9 depicts a portion of a communication device 900 (such as device 100 in FIG. 1) having tunable matching networks for use with a multiple antenna system. Device 900 depicts an exemplary embodiment in which the transmit/receive antenna 905, the diversity antenna 920 and tunable matching networks 910 and 925 are connected to the directional coupler 975 and front end module 960 through a switching element 930, which enables the two antennas 905 and 920 to be switched between the two corresponding connections to the FEM 960. In one embodiment, the switching element 930 can be a double-pole double-throw RF switch, although other switching components and techniques are also contemplated. This exemplary embodiment can allow the two antennas 905 and 920 to be tuned independently using the transmitted signal present at the detector 901 coupled to the directional coupler 975. Various tuning methods or algorithms could be used to tune each antenna, such as described above and/or in U.S. Patent Application Publication US 2009/0121963. When an antenna is connected to the diversity receiver path, the tuning network 925 can be offset appropriately to adjust it to the receive frequency of operation. The transmit/receive antenna 905 can be tuned for various communication protocols or techniques, including TDD and/or FDD operation.

In one embodiment, tuning algorithms can be modified with the additional step of switching the paths between transmit/receive and diversity reception in order to update the tuning of the two antennas 905 and 920 on a frequent basis. Since the diversity reception antenna 920 may not be as well suited for transmission as the transmit/receive antenna 905, the amount of time the algorithm spends with the transmitter connected to the diversity receive antenna 920 may be reduced or otherwise kept to a minimum, but enough to provide for tuning feedback to correct for environmental detuning.

In another embodiment, the switch 930 can drive the diversity antenna 930 directly so that the system effectively is providing antenna switching diversity on the transmit path. For example, relative reception levels on the two paths can be monitored in order to select which antenna is used to transmit. For instance, averaging or other analysis techniques can be utilized, which would then give an indication of which antenna is experiencing more interference (e.g., being smothered) and is experiencing the higher dissipative loss, such as due to nearby body effects. Continuing with this example, step phase changes could be accounted for by timing the switching to periods when the transmitter is inactive for an extended time and the limitation on phase change is relaxed or non-existent. This example could be utilized for a variety of situations, including at times other than when there are rapid changes in signal due to fading. The present disclosure also contemplates performing calibration of transmit and receive power levels when performing the antenna switching methodology described above.

Figure 10:
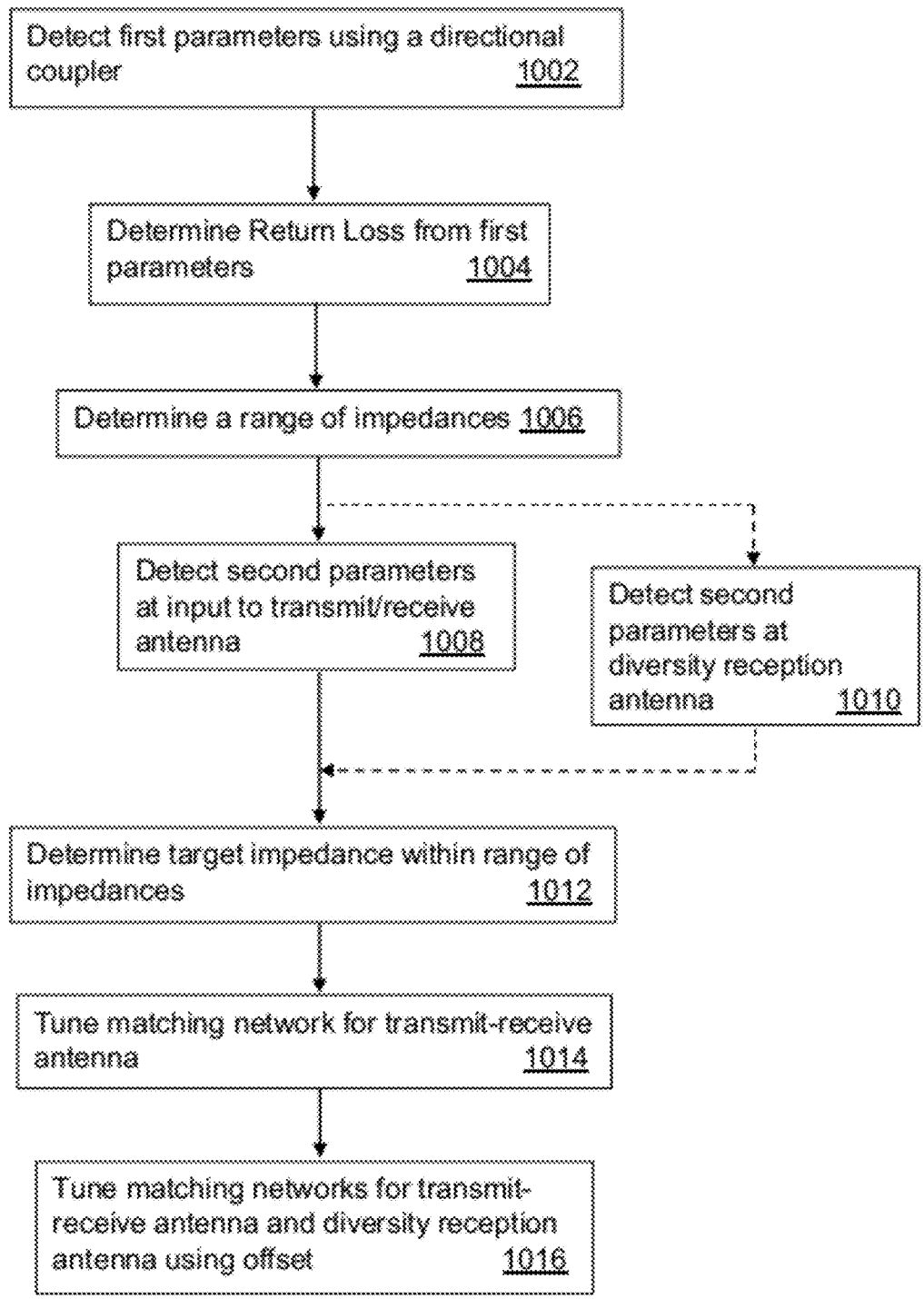
FIG. 10 depicts an exemplary method operating in portions of one or more of the devices of FIGS. 1-9.

FIG. 10 depicts an exemplary method 1000 operating in portions of one or more of the devices of FIGS. 1-9. Method 1000 can be utilized with communication devices of various configurations, including multiple antenna devices. Method 1000 can begin with step 1002 by detecting first parameters associated with transmitting of the communication device, such as using a directional coupler connected between a front end module and a matching network of a transmit/receive antenna. The directional coupler can take measurements based on the forward and reverse signals and in step 1004 a maximum return loss or voltage standing wave ratio (VSWR) can be determined from the first parameters.

Utilizing this return loss or VSWR information, a range of impedances for an acceptable level of performance of the communication device can be established in step 1006. Method 1000 can next determine a second set of parameters that can be utilized for tuning For instance, in step 1008, a detector positioned at the input of the transmit/receive antenna can detect the second parameters, such as changes or increases in transmitted RF power. In another example in step 1010, the second parameters can be detected by a detector positioned at the input of the diversity reception antenna based on inherent coupling of RF energy between the antennas when they are positioned in proximity to each other in a device. In this example, the communication device can operate without a detector positioned at the input to the transmit/receive antenna, which has the advantage of cost savings. This example, measures increases in transmitted RF power coupled to the diversity reception antenna.

In step 1012, a target impedance within the range of impedances can be determined using the second parameters. In step 1014, the matching network for the transmit/receive antenna can be tuned based on the target impedance. For example, method 1000 can continue to modify the matching network of the transmit/receive antenna to increase the detected RF voltage while constraining the return loss within a desired range. In step 1016, an offset can be applied for tuning of the antennas in the receive mode. The offset can be based on the techniques described above, such as based on a translation where the frequency offset is known for the receive mode.

In one embodiment, the tuning of the matching network(s) can be performed in combination with look-up tables such as shown in FIG. 11. For instance, one or more desirable performance characteristics of a communication device 100 can be defined in the form of Figures of Merits (FOMs), the communication device can be adapted to find a range of tuning states that achieve the desired FOMs by sweeping a mathematical model in fine increments to find global optimal performance with respect to the desired FOMs. In one embodiment, look-up table 1100 can be indexed (e.g., by the controller 106 of the communication device 100 of FIG. 1) during operation according to band, and use case.

From the foregoing descriptions, it would be evident to an artisan with ordinary skill in the art that the aforementioned embodiments can be modified, reduced, or enhanced without departing from the scope and spirit of the claims described below. For example, detector 830 may include a directional coupler for the diversity antenna to compensate for out-of-band impedance of the Rx filter that may create a very high standing wave on the feed line and put voltage nulls at unpredictable places on the line (including at the base of the antenna).

Other suitable modifications can be applied to the present disclosure. Accordingly, the reader is directed to the claims for a fuller understanding of the breadth and scope of the present disclosure.

Figure 12:
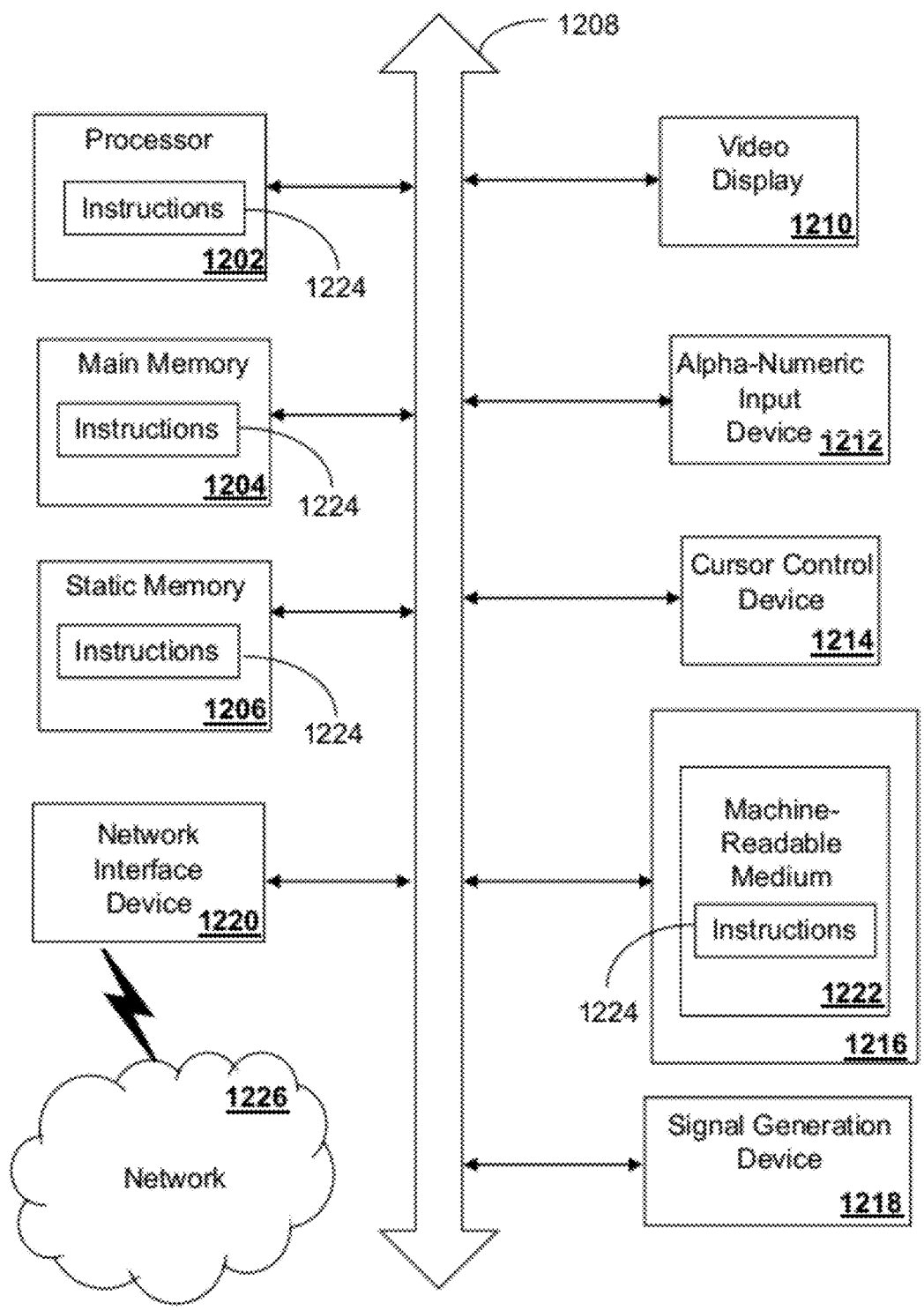
FIG. 12 depicts an exemplary diagrammatic representation of a machine in the form of a computer system within which a set of instructions, when executed, may cause the machine to perform any one or more of the methodologies disclosed herein.

FIG. 12 depicts an exemplary diagrammatic representation of a machine in the form of a computer system 1200 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 1200 may include a processor 1202 (e.g., a central processing unit (CPU), a graphics processing unit (GPU, or both), a main memory 1204 and a static memory 1206, which communicate with each other via a bus 1208. The computer system 1200 may further include a video display unit 1210 (e.g., a liquid crystal display (LCD), a flat panel, a solid state display, or a cathode ray tube (CRT)). The computer system 1200 may include an input device 1212 (e.g., a keyboard), a cursor control device 1214 (e.g., a mouse), a disk drive unit 1216, a signal generation device 1218 (e.g., a speaker or remote control) and a network interface device 1220.

The disk drive unit 1216 may include a machine-readable medium 1222 on which is stored one or more sets of instructions (e.g., software 1224) embodying any one or more of the methodologies or functions described herein, including those methods illustrated above. The instructions 1224 may also reside, completely or at least partially, within the main memory 1204, the static memory 1206, and/or within the processor 1202 during execution thereof by the computer system 1200. The main memory 1204 and the processor 1202 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 1224, or that which receives and executes instructions 1224 from a propagated signal so that a device connected to a network environment 1226 can send or receive voice, video or data, and to communicate over the network 1226 using the instructions 1224. The instructions 1224 may further be transmitted or received over a network 1226 via the network interface device 1220.

While the machine-readable medium 1222 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A matching network for a communication device having first and second antennas, the matching network comprising:
    a first variable component connectable along a first path between the first antenna and a front end module of the communication device; and
    a detector connectable along a second path between the second antenna and the front end module of the communication device, wherein the detector obtains an RF voltage associated with the second path, and wherein the first variable component is adjusted based on derivative information associated with the detected RF voltage to tune the matching network, wherein the derivative information is determined by calculating a finite difference of two sequential measurements associated with reactance settings for the matching network.

2. The matching network of claim 1, wherein the first antenna is configured for transmit and receive operation, and wherein the second antenna is configured for a diversity receive operation.

3. The matching network of claim 1, comprising a second variable component connectable along the second path between the second antenna and the front end module of the communication device, wherein the RF voltage is obtained from an output of the second variable component.

4. The matching network of claim 1, wherein the detector is connectable along the second path using a capacitive coupling.

5. The matching network of claim 4, wherein the capacitive coupling comprises a plurality of capacitors to sample power at multiple points along the second path.

6. The matching network of claim 1, wherein the detector is connectable along the second path using a resistive coupling.

7. The matching network of claim 1, wherein the detector is connectable along the second path using a directional coupler.

8. The matching network of claim 1, wherein the tuning of the matching network is performed for the transmit operation.

9. The matching network of claim 1, wherein the tuning of the matching network is performed for duplex operation of the communication device using the derivative information associated with the detected RF voltage.

10. The matching network of claim 1, wherein the tuning of the matching network is performed for the receive operation using the derivative information associated with the detected RF voltage.

11. A method of operating a handset having a transmitter and first and second antennas, the method comprising:
    setting a first tunable capacitor to a first value;
    setting a second tunable capacitor to a second value;
    transmitting power from the first antenna;
    measuring a first response at the second antenna;
    setting the first tunable capacitor to a third value;
    measuring a second response at the second antenna;
    calculating a finite difference with respect to the first tunable capacitor based on the first and second responses;
    calculating a figure of merit that includes the finite difference; and
    tuning a matching network based on the figure of merit.

12. The method of claim 11, wherein the matching network is coupled to the first antenna.

13. The method of claim 11, wherein the matching network is coupled to the second antenna.

14. The method of claim 11, comprising:
    setting the second tunable capacitor to a fourth value;
    measuring a third response at the second antenna;
    calculating another finite difference with respect to the second tunable capacitor based on the third response; and
    calculating another figure of merit that includes the finite difference with respect to the first tunable capacitor and the other finite difference with respect to the second tunable capacitor.

15. The method of claim 11, wherein the handset operates in a frequency division multiplex mode.

16. The method of claim 11, comprising calculating another figure of merit that includes a tuning state of the first and second tunable capacitors.

17. The method of claim 11, comprising:
    tuning the matching network to a compromise between an optimal transmit performance and an optimal receive performance.

18. A communication device comprising:
first and second antennas;
a transmitter;
a matching network coupled with the transmitter; and
a controller coupled with the matching network, wherein the controller performs operations comprising:
setting a first tunable capacitor to a first value;
setting a second tunable capacitor to a second value;
transmitting power from the first antenna;
measuring a first response at the second antenna;
setting the first tunable capacitor to a third value;
measuring a second response at the second antenna;
calculating a finite difference with respect to the first tunable capacitor based on the first and second responses;
calculating a figure of merit that includes the finite difference; and
tuning the matching network based on the figure of merit.

* * * * *